(12) United States Patent
Lee et al.

(10) Patent No.: US 10,840,476 B2
(45) Date of Patent: Nov. 17, 2020

(54) ORGANIC LIGHT EMITTING DISPLAY DEVICE

(71) Applicant: LG Display Co., Ltd., Seoul (KR)

(72) Inventors: HyunKyung Lee, Mungyeong-si (KR); DongWook Choi, Incheon (KR); GiJung Jo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/818,222

(22) Filed: Nov. 20, 2017

(65) Prior Publication Data

US 2018/0183001 A1    Jun. 28, 2018

(30) Foreign Application Priority Data

Dec. 22, 2016    (KR) .......................... 10-2016-0177097

(51) Int. Cl.
*H01L 51/52* (2006.01)
*H01L 51/00* (2006.01)
*H01L 27/32* (2006.01)

(52) U.S. Cl.
CPC ...... *H01L 51/5246* (2013.01); *H01L 51/0097* (2013.01); *H01L 51/5281* (2013.01); *H01L 27/3276* (2013.01); *H01L 2251/5338* (2013.01)

(58) Field of Classification Search
CPC ............. H01L 51/0097; H01L 51/5249; H01L 51/5293; H01L 51/5281; H01L 51/5246;
(Continued)

(56) References Cited

U.S. PATENT DOCUMENTS 6,475,609 B1 *  11/2002  Whitney ................. B32B 7/02
                                                        428/212
9,276,055 B1 *   3/2016  Son ........................ H01L 27/323
(Continued)

FOREIGN PATENT DOCUMENTS

KR    20140085956    7/2014

*Primary Examiner* — Vincent Wall
(74) *Attorney, Agent, or Firm* — Fenwick & West LLP

(57) ABSTRACT

An organic light emitting display device according to an exemplary embodiment of the present disclosure includes a flexible substrate, a polarization layer, an adhesive layer, and a micro coating layer. The flexible substrate includes a display area in which a display unit is disposed, a first non-display area which encloses the display area, a bending area extending from the first non-display area, and a second non-display area extending from one side of the bending area. The polarization layer is disposed on the display unit. The adhesive layer is disposed on at least one of a lower surface and an upper surface of the polarization layer. The micro coating layer is disposed to cover a plurality of wiring lines on the bending area. In this case, at least a part of the side of the adhesive layer adjacent to the bending area is located inside more than a side of the polarization layer adjacent to the bending area. In the organic light emitting display device according to an exemplary embodiment of the present disclosure, the side of the adhesive layer adjacent to the bending area is located more than the side of the polarization layer adjacent to the bending area or a side of the adhesive layer forms a concavely recessed concave portion to form a receiving portion which receives the micro coating layer.

13 Claims, 14 Drawing Sheets

(58) Field of Classification Search
CPC ...... H01L 51/524–5259; H01L 51/5237; C09J 2203/318
See application file for complete search history.

(56) References Cited

U.S. PATENT DOCUMENTS

| | | | | |
|---|---|---|---|---|
| 9,287,329 | B1* | 3/2016 | Lee | H01L 51/5262 |
| 9,356,087 | B1* | 5/2016 | Lee | H01L 27/3279 |
| 9,425,418 | B2* | 8/2016 | Kwon | H01L 27/3276 |
| 9,627,463 | B2* | 4/2017 | Kwon | H01L 27/3276 |
| 9,706,607 | B2* | 7/2017 | Kim | H05B 33/04 |
| 9,773,853 | B2* | 9/2017 | Tao | H01L 27/3297 |
| 9,818,974 | B2* | 11/2017 | Kwon | H01L 51/5253 |
| 10,153,457 | B2* | 12/2018 | Son | H01L 51/5253 |
| 10,185,200 | B1* | 1/2019 | Sprague | G02F 1/167 |
| 2003/0043315 | A1* | 3/2003 | Umemoto | G02F 1/133615 349/65 |
| 2003/0178724 | A1* | 9/2003 | Koyanagi | H01L 23/49565 257/736 |
| 2005/0206016 | A1* | 9/2005 | Shohji | H01L 21/563 257/787 |
| 2006/0267164 | A1* | 11/2006 | Chung | H01L 23/4985 257/668 |
| 2010/0157514 | A1* | 6/2010 | Johnson | H01L 51/5281 361/679.01 |
| 2011/0012845 | A1* | 1/2011 | Rothkopf | H05K 1/09 345/173 |
| 2014/0049449 | A1* | 2/2014 | Park | G09G 5/00 345/1.3 |
| 2014/0049522 | A1* | 2/2014 | Mathew | H01L 51/5293 345/204 |
| 2014/0183473 | A1 | 7/2014 | Lee et al. | |
| 2014/0217373 | A1* | 8/2014 | Youn | H01L 51/5203 257/40 |
| 2014/0217382 | A1* | 8/2014 | Kwon | H01L 51/5246 257/40 |
| 2014/0217397 | A1* | 8/2014 | Kwak | H01L 27/1218 257/43 |
| 2014/0232956 | A1* | 8/2014 | Kwon | G02F 1/133305 349/12 |
| 2014/0306941 | A1* | 10/2014 | Kim | H04M 1/0268 345/204 |
| 2015/0070840 | A1* | 3/2015 | Rappoport | H05K 1/0281 361/679.56 |
| 2015/0346408 | A1* | 12/2015 | Mizutani | C09J 133/08 428/41.5 |
| 2015/0382446 | A1* | 12/2015 | Kwon | H05K 1/028 174/251 |
| 2016/0064466 | A1* | 3/2016 | Son | H01L 27/3276 257/40 |
| 2016/0105950 | A1* | 4/2016 | Drzaic | B05D 3/002 174/251 |
| 2016/0165677 | A1* | 6/2016 | Lee | H05B 33/10 313/504 |
| 2016/0174304 | A1 | 6/2016 | Kim et al. | |
| 2017/0040306 | A1* | 2/2017 | Kim | H05K 1/181 |
| 2017/0047547 | A1* | 2/2017 | Son | H01L 25/167 |
| 2018/0047802 | A1* | 2/2018 | Yoon | H01L 27/3262 |
| 2018/0062090 | A1* | 3/2018 | Kim | H01L 51/5253 |
| 2018/0114944 | A1* | 4/2018 | Son | H01L 51/5253 |
| 2018/0134922 | A1* | 5/2018 | Katami | H01L 51/5246 |
| 2018/0197933 | A1* | 7/2018 | Son | H01L 51/5253 |

* cited by examiner

ORGANIC LIGHT EMITTING DISPLAY DEVICE

CROSS-REFERENCE TO RELATED APPLICATIONS

This application claims the priority of Republic of Korea Patent Application No. 10-2016-0177097 filed on Dec. 22, 2016, in the Korean Intellectual Property Office, the disclosure of which is incorporated herein by reference in its entirety.

BACKGROUND

Field of Technology

The present disclosure relates to an organic light emitting display device, and more particularly, to an organic light emitting display device which may implement a narrow bezel and thin thickness.

Description of the Related Art

A display device which implements various information through a screen is a core device of an information communication era and is studied to be developed as a display device which is thinner, lighter, and portable and displays a high quality image. Display devices include an organic light emitting display device which is a self-emitting device, a plasma display device, and a liquid crystal display which requires a separate light source. Since the organic light emitting display device is implement without using a separate light source device, the organic light emitting display device may be easily implemented as a flexible display device. In this case, a flexible material such as plastic or metal foil is used for a substrate of the organic light emitting display device.

In the meantime, when the organic light emitting display device is implemented as a flexible display, studies have been carried out to wrap or bend various parts of a display device using a flexible property. Such studies are carried out mainly for new designs and User Interface (UI)/User Experience (UX) and in some cases, the studies are carried out to reduce a size of a bezel of the display device.

As described above, when the substrate is bent in order to reduce a size of a bezel of the display device, it is required to secure not only a flexibility of the substrate, but also a flexibility of various insulating layers formed on the substrate and wiring lines which are formed of a metal material.

In the case of wiring lines, when the substrate on which the wiring lines are formed is bent, a stress is intensively generated in a wiring line which is disposed in the bent area so that the wiring line may be cracked. When the wiring line is cracked, the signals may not be normally transmitted so that a thin film transistor or an organic light emitting element is not normally operated, which results in malfunction of the light emitting display device.

In the case of the insulating layer, an inorganic film or an organic film which configures the insulating layer has brittleness, so that the flexibility of the insulating layer is considerably lower than that of the wiring line which is formed of metal. Therefore, when the substrate on which the insulating layer is formed is bent, the insulating layer is also cracked due to the stress caused by the bending.

When a partial area of the insulating layer is cracked, the crack is propagated to other areas of the insulating layer and is also propagated to a wiring line which is in contact with the insulating layer, which results in malfunction of the organic light emitting display device.

SUMMARY

An object to be achieved by the present disclosure is to provide an organic light emitting display device which minimizes a stress which is applied to a wiring line disposed in the bending area to implement a narrow bezel or bezel free.

Another object to be achieved by the present disclosure is to provide a thin organic light emitting display device by removing a barrier film which is used to protect an organic light emitting element.

Still another object to be achieved by the present disclosure is to minimize an overflow failure which is generated during a process of forming a micro coating layer to be formed in a bending area when a barrier film is removed.

Objects of the present disclosure are not limited to the above-mentioned objects, and other objects, which are not mentioned above, can be clearly understood by those skilled in the art from the following descriptions.

According to an aspect of the present disclosure, there is provided an organic light emitting display device including a flexible substrate, a polarization layer, an adhesive layer, and a micro coating layer. The flexible substrate includes a display area in which a display unit is disposed, a first non-display area which encloses the display area, a bending area extending from the first non-display area, and a second non-display area extending from one side of the bending area. The polarization layer is disposed on the display unit. The adhesive layer is disposed on at least one of a lower surface and an upper surface. The micro coating layer is disposed to cover a plurality of wiring lines on the bending area. In this case, at least a part of the side of the adhesive layer which is adjacent to the bending area is located inside more than a side of the polarization layer which is adjacent to the bending area. In the organic light emitting display device according to the exemplary embodiments of the present disclosure, a side of the adhesive layer adjacent to the bending area is disposed inside more than the side of the polarization layer adjacent to the bending area or the side of the adhesive layer forms a concavely recessed concave portion to form a receiving portion which receives the micro coating layer. The receiving portion suppresses overflow of the micro coating layer and thus removes the barrier film so that a thin organic light emitting display having a narrow bezel may be implemented.

According to another aspect of the present disclosure, there is provided an organic light emitting display device including a flexible substrate, a display unit, a polarization layer, an adhesive layer, and a micro coating layer. The flexible substrate includes a display area in which a display unit is disposed, a first non-display area which encloses the display area, a bending area which extends from the first non-display area, and a second non-display area which extends from one side of the bending area. The display unit is formed in the display area of the flexible substrate. The polarization layer is disposed on the display layer. The adhesive layer is disposed on the polarization layer. The micro coating layer is disposed on the bending area of the flexible substrate to cover a plurality of wiring lines on the bending area. In this case, one end of the adhesive layer which is adjacent to the bending area is located inside more than one end of the polarization layer.

According to another aspect of the present disclosure, there is provided an organic light emitting display device including a flexible substrate, a display unit, a polarization layer, an adhesive layer, and a micro coating layer. The flexible substrate includes a display area in which a display unit is disposed, a first non-display area which encloses the display area, a bending area which extends from the first non-display area, and a second non-display area which extends from one side of the bending area. The display unit is formed in the display area of the flexible substrate. The polarization layer is disposed on the display layer. The adhesive layer is formed on at least one of a lower surface and an upper surface of the polarization layer. The micro coating layer is disposed on the bending area of the flexible substrate to cover a plurality of wiring lines on the bending area. In this case, the side of the adhesive layer includes a concavely recessed concave portion.

Other detailed matters of the exemplary embodiments are included in the detailed description and the drawings.

According to the present disclosure, a barrier film is removed so that a thickness of the organic light emitting display device is reduced, thereby implementing a thin organic light emitting display device.

According to the present disclosure, when a barrier film is removed, an overflow failure which is generated during a process of forming a micro coating layer disposed in the bending area may be minimized.

The present disclosure may provide an organic light emitting display device which implements a narrow bezel or bezel free.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
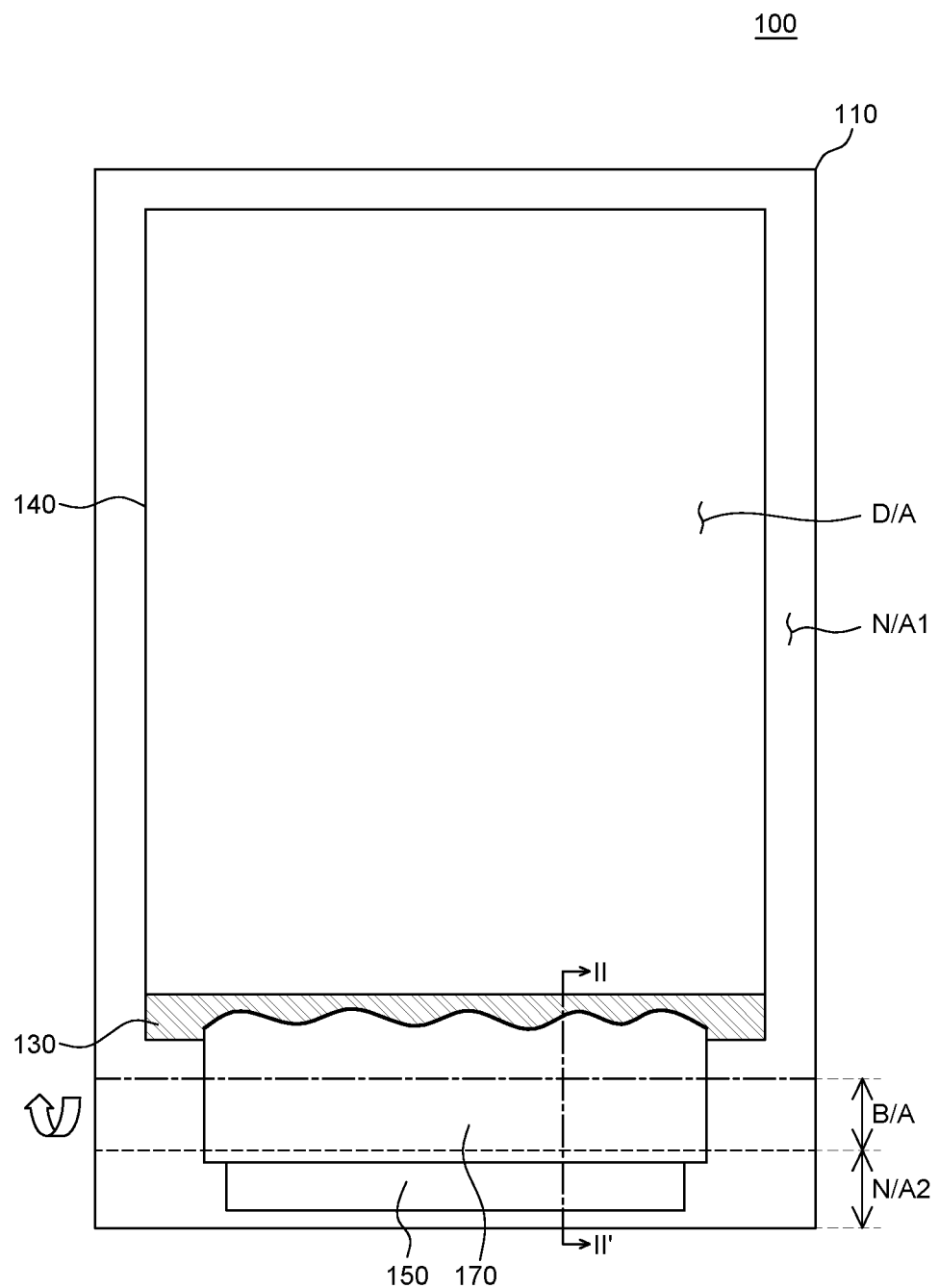
FIG. 1A is a schematic plan view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiments disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

In this specification, the flexible display device means a display device having a flexibility and also used as the same meaning as a bendable display device, a rollable display, an unbreakable display device, a foldable display device, a twistable display device, a stretchable display, and a wrinkable display device. In this specification, the flexible organic light emitting display device means an organic light emitting display device among various flexible display devices.

The features of various embodiments of the present disclosure can be partially or entirely adhered to or combined with each other and can be interlocked and operated in technically various ways as understood by those skilled in the art, and the embodiments can be carried out independently of or in association with each other.

Hereinafter, various exemplary embodiments of the present disclosure will be described in detail with reference to accompanying drawings.

Figure 1B:
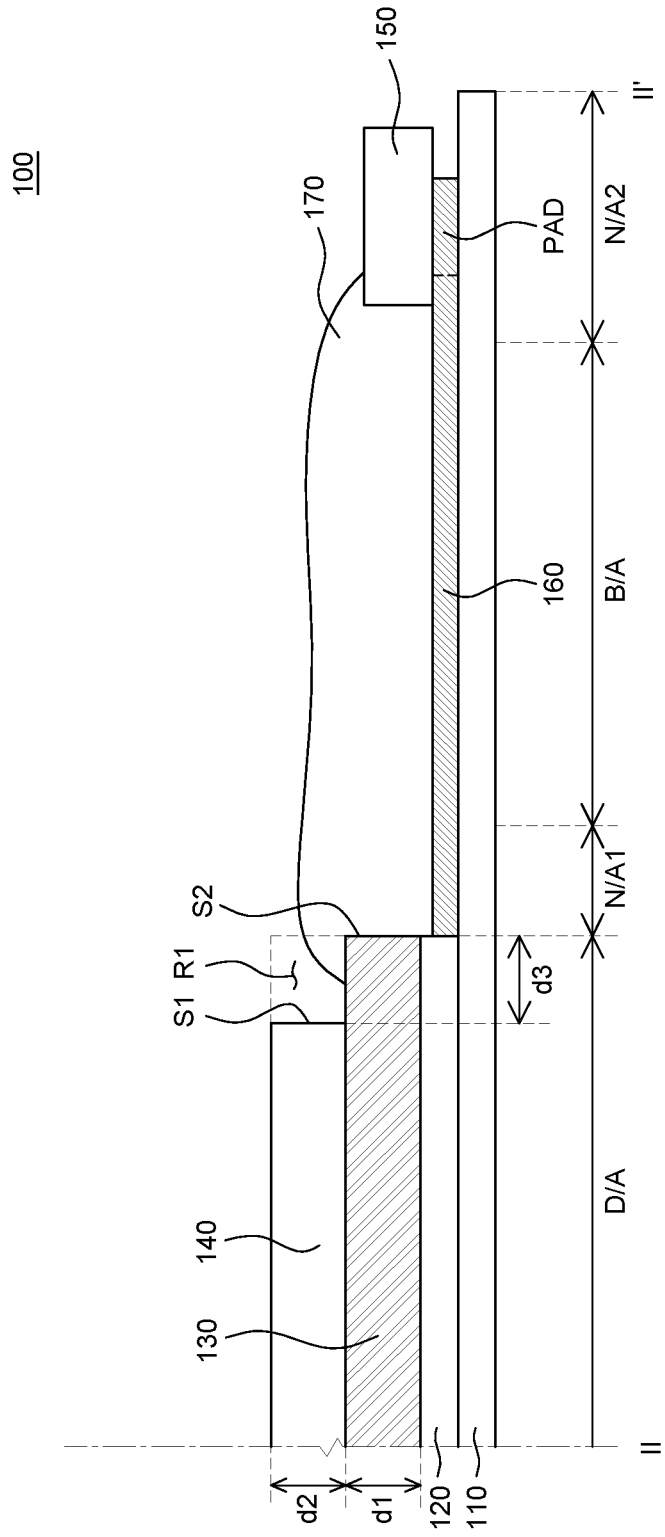
FIG. 1B is a cross-sectional view taken along the line II-II' of FIG. 1A according to an exemplary embodiment of the present disclosure.

FIG. 1A is a schematic plan view of an organic light emitting display device according to an exemplary embodiment of the present disclosure. FIG. 1B is a cross-sectional view taken along the line II-II' of FIG. 1A according to an exemplary embodiment of the present disclosure. Referring to FIGS. 1A and 1B, the organic light emitting display device 100 includes a flexible substrate 110, a display unit 120, a polarization layer 130, an adhesive layer 140, a module 150, a plurality of wiring lines 160, a pad unit PAD, and a micro coating layer 170. A specific shape of a thin film transistor and an organic light emitting element which are included in the display unit 120 is omitted in FIGS. 1A and 1B.

The flexible substrate 110 is a substrate which supports several components of the organic light emitting display device 100. The flexible substrate 110 may be bent. For example, the flexible substrate 110 may be bent in a horizontal direction, a vertical direction, or a diagonal direction. Therefore, the flexible substrate 110 may be bent in a combination of the vertical, horizontal, and diagonal directions, based on a design required for the organic light emitting display device 100.

The flexible substrate 110 may be formed of a material having flexibility so as to be bent. For example, the flexible substrate 110 may be implemented by a thin film plastic film formed of a polymer such as polyimide, polyethylene naphthalate (PEN), or polyethylene terephthalate (PET).

The flexible substrate 110 includes a display area D/A, a first non-display area N/A1, a bending area B/A, and a second non-display area N/A2.

The display area D/A is an area where the display unit 120 is disposed. The display area means an area where an image is displayed and is referred to as an active area. The first non-display area N/A1 may be disposed around the display area D/A. The first non-display area N/A1 may be referred to as an inactive area.

The first non-display area N/A1 may be in contact with one or more sides of the display area D/A. For example, as illustrated in FIG. 1, the non-display area N/A1 encloses a quadrangular display area D/A. However, a shape and an arrangement of the display area D/A and the first non-display area N/A1 which is in contact with the display area D/A are not limited to the example illustrated in FIG. 1.

The display area D/A and the first non-display area N/A1 may have a shape appropriate for a design of an electronic apparatus in which the organic light emitting display device 100 is mounted. For example, the display area D/A may be formed in the form of a pentagon, a hexagon, a circle, or an ellipse. In the first non-display area N/A1, a gate driver and a data driver which are driving circuit units to allow the display unit 120 of the display area D/A to emit light and wiring lines are disposed. The gate driver and the data driver may be implemented by thin film transistors (TFT). The drivers may be referred to as a gate-in-panel (GIP).

The bending area B/A is disposed to extend from one side of the first non-display area N/A1. The bending area B/A is an area where the flexible substrate 110 is bent and serves as a non-display area where an image is not displayed. However, the present disclosure is not limited thereto and the organic light emitting display device 100 may be implemented such that the image is also displayed in the bending area B/A. That is, a part of the display area D/A may be bent. In this case, an image may be displayed in a bent area of the display area D/A. In FIGS. 1A and 1B, it is illustrated that the bending area B/A of the flexible substrate 110 is connected to the first non-display area N/A1 which completely encloses the display area D/A. However, the bending area B/A may be a non-display area which is directly connected to the display area D/A.

The second non-display area N/A2 may be disposed to extend from one side of the bending area B/A. The second non-display area N/A2 may be defined as a non-bending area B/A which is disposed in an opposite side of the first non-display area N/A1 with respect to the bending area B/A.

The display unit 120 is disposed on the flexible substrate 110. The display unit 120 may be disposed so as to correspond to the display area D/A of the flexible substrate 110, but is not limited thereto.

The display unit 120 may be configured to display an image. Even though not illustrated in FIGS. 1A and 1B, the display unit 120 may include an organic light emitting element and a driving circuit for driving the organic light emitting element. The organic light emitting element includes an anode, a plurality of organic layers, and a cathode so that electrons and holes are coupled to each other to emit light. The plurality of organic layers includes a hole injection layer HIL, a hole transport layer HTL, an organic emitting layer EML, an electron transport layer ETL, and an electron injection layer EIL, but is not limited thereto. Further, the driving circuit is a circuit unit which drives the organic light emitting element. The driving circuit may be formed of various circuit components such as a switching thin film transistor, a driving thin film transistor, and a capacitor and various wiring lines, but is not limited thereto. Even though not illustrated in FIGS. 1A and 1B, various insulating layers may be formed between the flexible substrate 110 and the display unit 120. Further, at least some of the insulating layers which are formed between the flexible substrate 110 and the display unit 120 may also be formed in the non-display areas N/A1 and N/A2, and the bending area B/A.

A plurality of wiring lines 160 is formed on the flexible substrate 110. The plurality of wiring lines 160 extends to the second non-display area N/A2 via the first non-display area N/A1 and the bending area B/A from the display area D/A to be connected to the pad unit PAD. The plurality of wiring lines 160 transmits various electric signals which is transmitted through the pad unit PAD to the driving circuit such as the thin film transistor of the display unit 120 disposed in the display area D/A. Since some of the plurality of wiring lines 160 are disposed on the bending area B/A, when the bending area B/A is bent, the plurality of wiring lines is also bent.

The plurality of wiring lines 160 may be formed of metal having excellent conductivity. For example, the plurality of wiring lines 160 may be formed of the same metal as the source electrode or the drain electrode of the thin film transistor. However, the plurality of wiring lines 160 is not limited thereto and may be formed of the same metal as a gate electrode of the thin film transistor.

Differently from the wiring lines disposed in the non-display area, the plurality of wiring lines 160 disposed in the bending area B/A is applied with a stress due to the bending of the flexible substrate 110. Therefore, the plurality of wiring lines disposed in the bending area needs to be designed to be strong against the stress and have a low resistance. Further, the plurality of wiring lines 160 needs to have sufficient flexibility to easily bend the flexible substrate 110. For example, the plurality of wiring lines 160 may have a single line structure having a zig-zag pattern or a repeated pattern structure having a rhombus shape. Further, the plurality of wiring lines 160 may be formed of a single metal layer structure or formed of a multiple layer structure in which a plurality of metal layers is laminated. Specifically, the plurality of wiring lines 160 may be formed of a layer of two or more selected from aluminum (Al), titanium (Ti), molybdenum (Mo), and copper (Cu) layers. An example of the combination includes a structure (Ti/Al/Ti) in which an aluminum layer is disposed between titanium layers, a structure (Mo/Al/Mo) in which an aluminum layer is disposed between molybdenum layers, a structure (Ti/Cu/Ti) in which a copper layer is disposed between titanium layers, and a structure (Mo/Cu/Mo) in which a copper layer is disposed between molybdenum layers. The plurality of wiring lines 160 having the above-described multilayer structure may have excellent conductivity due to a low contact resistance between the metal layers while maintaining a sufficient flexibility.

In the meantime, even though not illustrated in FIGS. 1A and 1B, in order to suppress corrosion or damage of the plurality of wiring lines 160, a protective layer may be formed on the plurality of wiring lines 160. In this case, the protective layer may be the same layer as one or more of various insulating layers such as a passivation layer which covers a thin film transistor of the display unit 120, a gate insulating layer which is used for electrical insulation between an active layer, the gate electrode, the source electrode, and the drain electrode in a thin film transistor, and an interlayer insulating layer.

The pad unit PAD is disposed in the second non-display area N/A2 of the flexible substrate 110. The pad unit PAD may be configured by a plurality of pad electrodes. The pad unit PAD is an area where the module 150 is attached to electrically connect the module 150 and the plurality of pad electrodes. Referring to FIG. 1B, the pad unit PAD may be a metal layer which extends from the plurality of wiring lines 160 extending from the bending area B/A. The second non-display area N/A2 is an area which is connected to the module 150 so that it is not bent but is planarized.

The module 150 is disposed on the pad unit PAD. The module 150 is a driving unit which supplies a data signal to the display unit 120 or a film which is connected to the driving unit.

For example, the module 150 may be an integrated circuit chip (IC chip) including a driving unit. The integrated circuit chip may be directly connected to the pad unit PAD to be directly mounted on an upper surface of the flexible substrate 110. The integrated circuit chip may be directly disposed on the flexible substrate 110 in a chip-on-film (COF) manner.

Further, the module 150 may be a flexible circuit film which is connected to a printed circuit board (PCB) on which the driving unit is disposed. The flexible circuit film transmits various signals from the printed circuit board to the display unit 120. A plurality of wiring lines 160 may be disposed on the flexible circuit film or in the flexible circuit film so that the printed circuit board and the pad unit PAD are electrically connected to each other. In the meantime, the flexible circuit film may be a flexible printed circuit board (FPCB) in which a separate printed circuit board is not attached, but the flexible circuit film serves as a printed circuit board.

The module 150 is electrically connected to the pad unit PAD. Therefore, the module 150 is disposed on the pad unit PAD disposed in the second non-display area N/A2 of the flexible substrate 110. Even though it is illustrated that both ends of the module 150 are disposed to protrude more than ends of the pad unit PAD in FIG. 1B, at least one end of the module 150 may be disposed to be aligned with one end of the pad unit PAD.

The polarization layer 130 is disposed on the display unit 120. The polarization layer 130 suppresses reflection of external light on the display unit 120. Specifically, when the organic light emitting display device 100 is used at the outside, external natural light enters to be reflected by a reflector included in the anode of the organic light emitting element or reflected by metal electrodes disposed below the organic light emitting element. In this case, the image of the organic light emitting display device may not be visibly recognized due to the reflected light. The polarization layer 130 polarizes the light entering from the outside to a specific direction and suppresses the light reflected by the reflector or the metal electrode of the anode from being emitted to the outside of the organic light emitting display device.

The polarization layer 130 may be disposed on the display area D/A of the flexible substrate 110, but is not limited thereto. Further, the polarization layer 130 may be disposed to correspond to the display unit 120, but is not limited thereto.

In the meantime, the polarization layer 130 may be a polarization plate which is formed of a polarizer and a protective film protecting the polarizer or a coating layer which is formed so as to coat a polarization material for flexibility. Even though not illustrated in FIGS. 1A and 1B, when the polarization layer 130 of the organic light emitting display device according to the exemplary embodiment of the present disclosure is formed of a polarization plate, an adhesive may be disposed between the display unit 120 and the polarization plate to bond the polarization plate and the display unit 120 to each other. The adhesive may be a thermosetting or natural curable adhesive. For example, the adhesive may be formed of a material such as pressure sensitive adhesive (PSA).

A thickness d1 of the polarization layer 130 may be appropriately adjusted as needed and a thickness of the polarization plate is generally 50 μm to 150 μm.

The adhesive layer 140 is disposed on the polarization layer 130. The adhesive layer 140 functions to bond a cover glass (not shown) which protects an exterior of the organic light emitting display device 100 and the polarization layer 130 to each other. The adhesive layer 140 may be formed of an optically clear adhesive (OCA) which has excellent light transmittance.

The adhesive layer 140 is disposed on the display area D/A of the flexible substrate 110. Referring to FIG. 1B, the adhesive layer 140 is disposed such that one end of the adhesive which is adjacent to the bending area B/A is disposed inside more than one end of the polarization layer 130 which is adjacent to the bending area B/A. That is, one side S1 of the adhesive layer 140 adjacent to the bending area B/A is formed to be inserted toward the display area D/A. Therefore, as compared with one side S1 of the adhesive layer 140, one side S2 of the polarization layer 130 is formed to protrude toward the bending area B/A so that a step is formed between the adhesive layer 140 and the polarization layer 130. Referring to FIG. 1A, the adhesive layer 140 is disposed to cover only a remaining portion of the upper surface of the polarization layer 130 excluding a portion which is adjacent to the bending area B/A. By doing this, a part of the upper surface of the polarization layer 130 which is adjacent to the bending area B/A is exposed and the remaining portion of the upper surface of the polarization layer 130 corresponding to the display area D/A is covered by the adhesive layer 140.

The step is formed between the side S1 of the adhesive layer 140 and the side S2 of the polarization layer 130 which are adjacent to the bending area B/A so that a receiving portion R1 is formed on the upper surface of the adhesive layer 140. Referring to FIG. 1B, the receiving portion R1 is a space formed on the same plane as the adhesive layer 140 and receives at least a part of the micro coating layer 170. By doing this, the receiving portion R1 may suppress overflow generated during a process of forming the micro coating layer 170. An arrangement relationship of the micro coating layer 170 related to the receiving portion R1 will be described below.

In this case, a distance d3 between the side S1 of the adhesive layer 140 which is disposed inside and the side S2 of the polarization layer 130 adjacent to the bending area B/A may be 30 µm to 300 µm. When the distance d3 between the side S1 of the adhesive layer 140 and the side S2 of the polarization layer 130 which form a step is less than 30 µm, it is difficult to suppress the overflow generated during the process of forming the micro coating layer 170. Further, when the distance d3 between the side S1 of the adhesive layer 140 and the side S2 of the polarization layer 130 exceeds 300 µm, the side S1 of the adhesive layer 140 is excessively formed inwardly to the display area D/A so that the adhesive layer 140 does not entirely cover the display area D/A. Therefore, the bonding with the cover glass is not sufficient later and an empty space is identified with a naked eye so that visibility may be deteriorated.

The thickness d2 of the adhesive layer 140 may be appropriately adjusted according to a necessary adhesiveness. Further, the thickness d2 of the adhesive layer 140 may be adjusted so as to serve as a buffer enough to protect an internal configuration of the organic light emitting display device 100 from a touch pressure applied by the user on an upper portion of the cover glass or an external impact. For example, the thickness d2 of the adhesive layer 140 may be 50 µm to 200 µm, but is not limited thereto.

Even though not illustrated in FIGS. 1A and 1B, a cover glass (not shown) is disposed on the adhesive layer 140. The cover glass (not shown) protects the upper surface of the organic light emitting display device 100. The cover glass (not shown) is disposed on the display area D/A and the first non-display area N/A1. In this case, the cover glass (not shown) may be disposed to outwardly protrude from the display area D/A and the first non-display area N/A1 so as to cover a bezel area which is formed after the bending area B/A is bent toward a rear surface.

The micro coating layer 170 is disposed in the display area D/A on the flexible substrate 110. The micro coating layer 170 is disposed to cover at least a part of the display area D/A of the flexible substrate 110 so as to cover the plurality of wiring lines 160 disposed on the display area D/A. The micro coating layer 170 may be disposed to extend from the display area D/A to the second non-display area N/A2. The micro coating layer 170 may be disposed to cover an adjacent corner of the module 150 disposed in the second non-display area N/A2. Further, the micro coating layer 170 may be disposed to extend from the display area D/A to the first non-display area N/A1. In this case, the micro coating layer 170 may be disposed to be in contact with the display unit 120 adjacent to the bending area B/A and the polarization layer 130.

Further, a part of the micro coating layer 170 may be disposed on the display area D/A. Referring to FIG. 1B, the micro coating layer 170 may be disposed in a partial area of the upper surface of the polarization layer 130 corresponding to the display area D/A. As described above, the side S1 of the adhesive layer 140 adjacent to the bending area B/A is disposed inside more than the side S2 of the polarization layer 130 adjacent to the bending area B/A, so that a step is formed between the side S1 of the adhesive layer 140 and the side S2 of the polarization layer 130. As illustrated in FIG. 1B, the receiving portion R1 is formed on the upper surface of the polarization layer 130 adjacent to the bending area B/A due to the step formed between the adhesive layer 140 and the polarization layer 130. Further, a part of the micro coating layer 170 may be disposed inside the receiving portion R1.

In FIG. 1B, even though it is illustrated that the micro coating layer 170 occupies a part of the receiving portion R1, the micro coating layer 170 may be disposed to be fully filled in the receiving portion R1. Further, even though it is illustrated that one end of the micro coating layer 170 in a direction of the display area D/A is spaced apart from the side S1 of the adhesive layer 140 adjacent to the bending area B/A in FIG. 1B, the end of the micro coating layer 170 may be disposed to be in contact with or completely close to the side S1 of the adhesive layer 140. In the meantime, when the part of the micro coating layer 170 is disposed in the receiving portion R1 formed by the step between the adhesive layer 140 and the polarization layer 130, an overflow phenomenon which may be generated at the time of forming the micro coating layer 170 may be suppressed.

Further, the micro coating layer 170 may protect the plurality of wiring lines 160 of the bending area B/A. To this end, the micro coating layer 170 may include a material which may suppress the permeation of moisture, such as a moisture absorbent or a desiccant.

Further, when the flexible substrate 110 and the plurality of wiring lines in the bending area B/A are bent to implement a narrow bezel, the micro coating layer 170 functions to adjust a neutral plane of the bending area B/A.

When a structure is bent, the neutral plane refers to a virtual plane on which a compressive force and a tensile force which are applied to the structure are cancelled so that no stress is applied. When two or more structures are laminated, a virtual neutral plane may be formed between the structures. When the entire structures are bent in one direction, structures disposed in the bending direction with respect to the neutral plane are compressed due to the bending so that the compressive force is applied to the structures. In contrast, structures which are disposed in an opposite direction to the bending direction with respect to the neutral plane are stretched due to the bending, so that the tensile force is applied to the structures. In this case, when the tensile force between the compressive force and the tensile force with the same magnitude is applied, the structures are weaker, so that when the tensile force is applied, a possibility of generating a crack is higher.

More specifically, the neutral plane is determined in consideration of a thickness, a Young's modulus, and a material of the components disposed in the corresponding area. For example, referring to FIG. 1B, when the bending area B/A is bent toward a rear surface, the neutral plane may be formed between the flexible substrate 110 and the plurality of wiring lines 160 or formed on the flexible substrate 110. Therefore, when the bending area B/A is bent toward the rear surface, the flexible substrate 110 which is disposed below the neutral plane is compressed so that the compressive force is applied to the flexible substrate. Further, the plurality of wiring lines 160 which is disposed above the neutral plane is applied with the tensile force. Therefore, the plurality of wiring lines 160 may be cracked due to the tensile force. Therefore, in order to minimize the tensile force which is applied to the plurality of wiring lines 160, it is considered to dispose the plurality of wiring lines 160 on the neutral plane.

Therefore, the micro coating layer 170 is disposed on the bending area B/A to raise the neutral plane in an upward direction. Specifically, when the micro coating layer 170 is disposed on the bending area B/A, the neutral plane may be formed in the same position as the plurality of wiring lines 160 or located in a higher position than the plurality of wiring lines 160. Therefore, the plurality of wiring lines 160 is not applied with the stress or applied with the compressive force at the time of bending, so that even though the bending area is bent toward the rear surface of the flexible substrate 110, the generation of the crack may be significantly suppressed.

As described above, the neutral plane is affected by the thickness and the Young's modulus of the micro coating layer 170 disposed on the bending area B/A. The larger the thickness of the micro coating layer 170, the higher the neutral plane. Therefore, in order to dispose the plurality of wiring lines 160 below the neutral plane, the thickness of the micro coating layer 170 may be increased. However, when the thickness of the micro coating layer 170 is too large, an entire thickness of the display device is increased, which hinders the reduction of the thickness of the organic light emitting display device and causes a problem in the manufacturing process of the organic light emitting display device. In contrast, when the thickness of the micro coating layer 170 is too small, the neutral plane may not be disposed below the plurality of wiring lines 160, so that it may be difficult to implement a sufficient adhesiveness. Therefore, the thickness of the micro coating layer 170 may be determined in consideration of the above description. For example, the thickness of the micro coating layer 170 may be 70 µm to 130 µm, but is not limited thereto.

Similarly, the Young's modulus of the micro coating layer 170 may be determined to locate the neutral plane below the plurality of wiring lines 160. The Young's modulus is a value indicating flexibility of a material and is a unique characteristic of a material which indicates a degree of resistance to tensile or compressive stress of the material. When a Young's modulus of a specific material is high, the resistance to the tensile or compressive stress is also large so that it is difficult to modify a shape of the material. In contrast, when the Young's modulus is low, the resistance to the tensile or compressive stress is low, so that it is easy to modify the shape of the material. When the Young's modulus of the micro coating layer 170 is high, the position of the neutral plane may be raised. However, when the Young's modulus of the micro coating layer 170 is too high, the micro coating layer 170 may be cracked during the bending process. Further, when the Young's modulus of the micro coating layer 170 is low, the neutral plane may not be disposed below the plurality of wiring lines 160. Therefore, the Young's modulus of the micro coating layer 170 may be determined in consideration of the above description. For example, the Young's modulus of the micro coating layer 170 may be 0.3 Gpa to 0.85 Gpa, but is not limited thereto. For example, the micro coating layer 170 may be formed of an acrylic material and may be formed of urethane acrylate.

According to the exemplary embodiment of the present disclosure, a barrier film is removed so that the thickness of the organic light emitting display device 100 may be reduced. When the barrier film is removed, the overflow failure which is generated during the process of forming the micro coating layer 170 disposed in the bending area B/A may be minimized.

In order to manufacture a thin organic light emitting display device, there is a tendency of omitting components which may be disposed in the display area D/A and the first non-display area N/A1. Therefore, a difference between a thickness of the bending area B/A and the thickness of the display area D/A and the first non-display area N/A1 is reduced. More specifically, in order to protect the organic light emitting element from moisture and foreign substances, the barrier film disposed above the display unit 120 has a thickness of approximately 150 µm or larger. Such a barrier film is removed so that the thickness on the display area D/A may be significantly reduced. When the barrier film is not used so that a total thickness of the components disposed in the display area D/A is reduced, a height of a dam which suppresses the coating composition from overflowing to the display area D/A during the process of forming the micro coating layer 170 in the bending area B/A is reduced. As a result, the height of the dam is reduced so that an overflow problem in that the micro coating composition flows over the upper surface of the adhesive layer 140 along the side of the display unit 120 and the polarization layer 130 may be caused. Further, when the overflow problem of the coating composition is generated, a looseness phenomenon may be generated during a process of bonding the cover glass on the polarization layer 130 and an air layer, for example, bubbles may be generated between the cover glass and the polarization layer 130 to be visibly recognized by the user.

Therefore, in the organic light emitting display device 100 according to the exemplary embodiment of the present disclosure, a step is formed between the adhesive layer 140 and the polarization layer 130 which are adjacent to the bending area B/A. By doing this, a receiving portion R1 which may receive the micro coating layer 170 may be formed on the upper surface of the polarization layer 130 which is adjacent to the bending area B/A. The receiving portion R1 receives the micro coating layer 170 which rises up along the side of the display unit 120 and the polarization layer 130 or overflows over the upper surface. Therefore, the micro coating layer 170 is located between the adhesive layer 140 and the cover glass so that various problems generated during the process of bonding the cover glass may be solved.

Figure 2A:
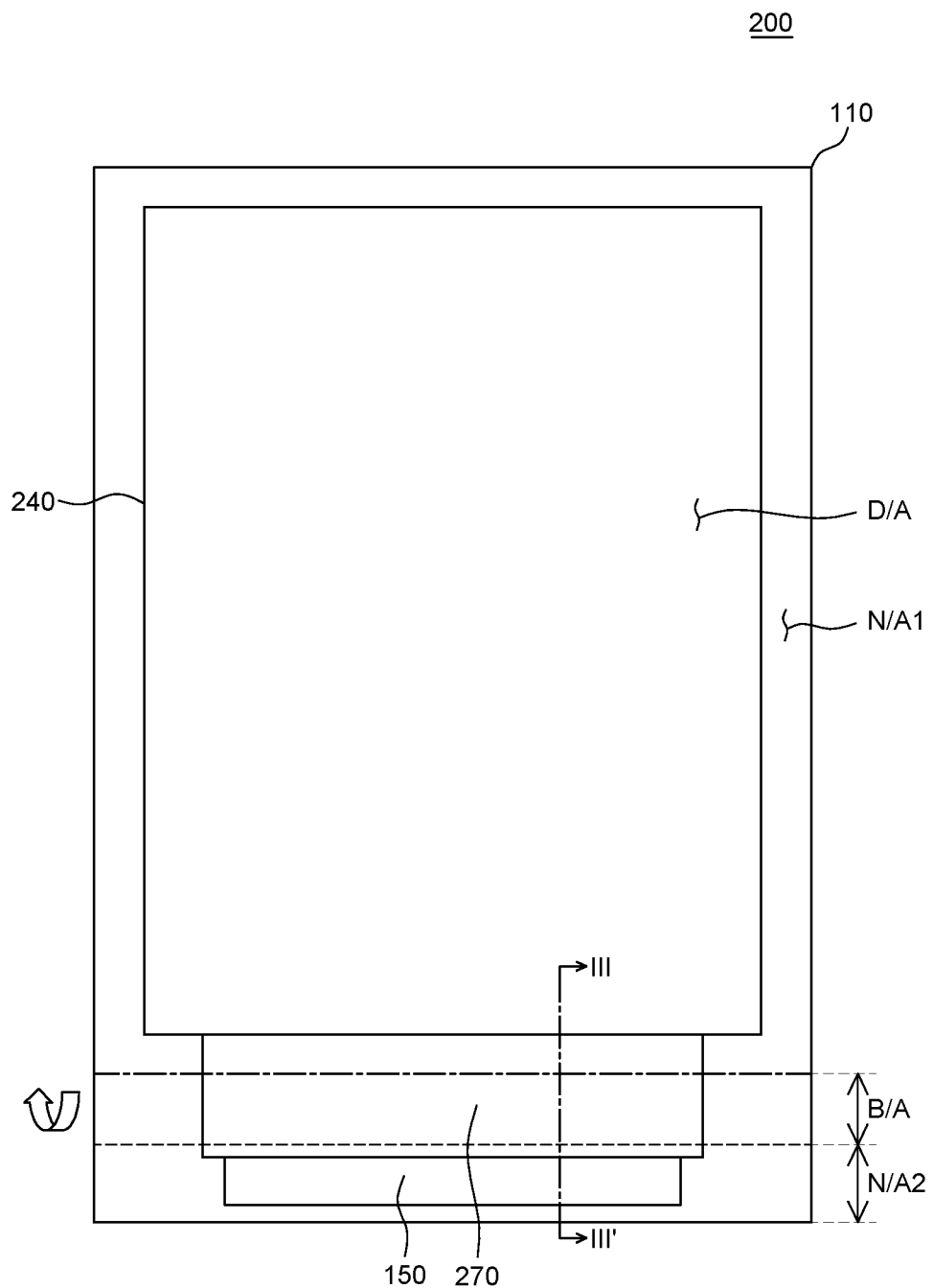
FIG. 2A is a schematic cross-sectional view of an organic light emitting display device according to another exemplary embodiment of the present disclosure.
Figure 2B:
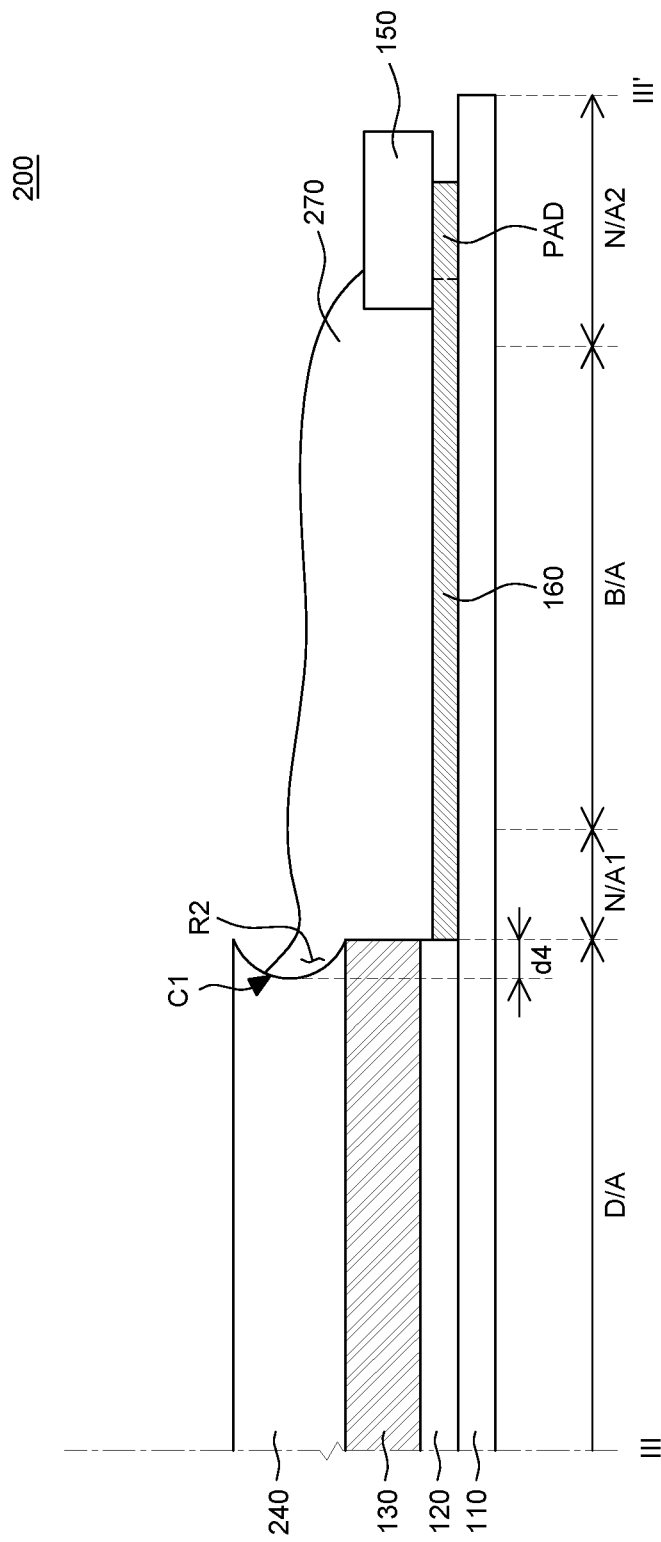
FIG. 2B is a cross-sectional view taken along the line III-III' of FIG. 2A according to an exemplary embodiment of the present disclosure.

FIG. 2A is a schematic cross-sectional view of an organic light emitting display device according to another exemplary embodiment of the present disclosure. FIG. 2B is a cross-sectional view taken along the line III-III' of FIG. 2A. An organic light emitting display device 200 illustrated in FIGS. 2A and 2B is substantially the same as the organic light emitting display device 100 illustrated in FIGS. 1A and 1B, except that structures of an adhesive layer 240, a receiving portion R2, and a micro coating layer 270 are different. Therefore, a redundant description will be omitted.

Referring to FIG. 2B, the adhesive layer 240 disposed on the polarization layer 130 includes a concave portion C1 in a side adjacent to the bending area B/A. Specifically, the side of the adhesive layer 240 adjacent to the bending area B/A has a concavely recessed shape. That is, as compared with the side of the polarization layer 130 adjacent to the bending area B/A, the side of the adhesive layer 240 inwardly forms a groove.

The adhesive layer 240 forms the receiving portion R2 by the concave portion C1 formed in the side adjacent to the bending area B/A. The receiving portion R2 is a space which is formed by an inwardly recessed side of the adhesive layer 240 adjacent to the bending area B/A and receives at least a part of the micro coating layer 270. Referring to FIG. 2B, a part of the micro coating layer 270 is disposed in the receiving portion R2 formed by the concave portion C1.

As described with reference to FIGS. 1A and 1B, the receiving portion R2 receives a part of the micro coating layer 270 disposed on the side of the display unit 120 and the polarization layer 130 so that the barrier film is not used. Therefore, it is possible to suppress the overflow of the micro coating layer 270 which may be generated when the total thickness of the components disposed in the display area D/A is reduced.

A shape and a size of the concave portion C1 may be appropriately adjusted according to the thickness and the material of the adhesive layer 240 and the thickness and the process of the micro coating layer 270. A depth d4 of the concave portion may be 30 μm to 150 μm, but is not limited thereto. The depth d4 of the concave portion refers to a distance between an outermost point of the adhesive layer 240 adjacent to the bending area B/A and an innermost point of the inwardly recessed concave portion C1. When the depth d4 of the concave portion C1 is less than 30 μm, it is difficult to form a sufficient receiving space which may suppress the overflow. Further, when the depth d4 of the concave portion C1 exceeds 150 μm, the micro coating layer 270 does not sufficiently fill the receiving portion R2 so that a space is generated. Therefore, there is a problem in that the space is recognized with the naked eye after manufacturing the organic light emitting display device 200.

In the meantime, in FIGS. 2A and 2B, a structure in which the adhesive layer 240 is disposed above the polarization layer 130 so that the receiving portion R2 formed by the concave portion C1 is formed above the polarization layer 130 is illustrated. However, the adhesive layer 240 and the receiving portion R2 may be disposed between the polarization layer 130 and the display unit 120. In the meantime, a method for forming the concave portion and the receiving portion by the concave portion will be described below with reference to FIGS. 4A to 4G.

Figure 3:
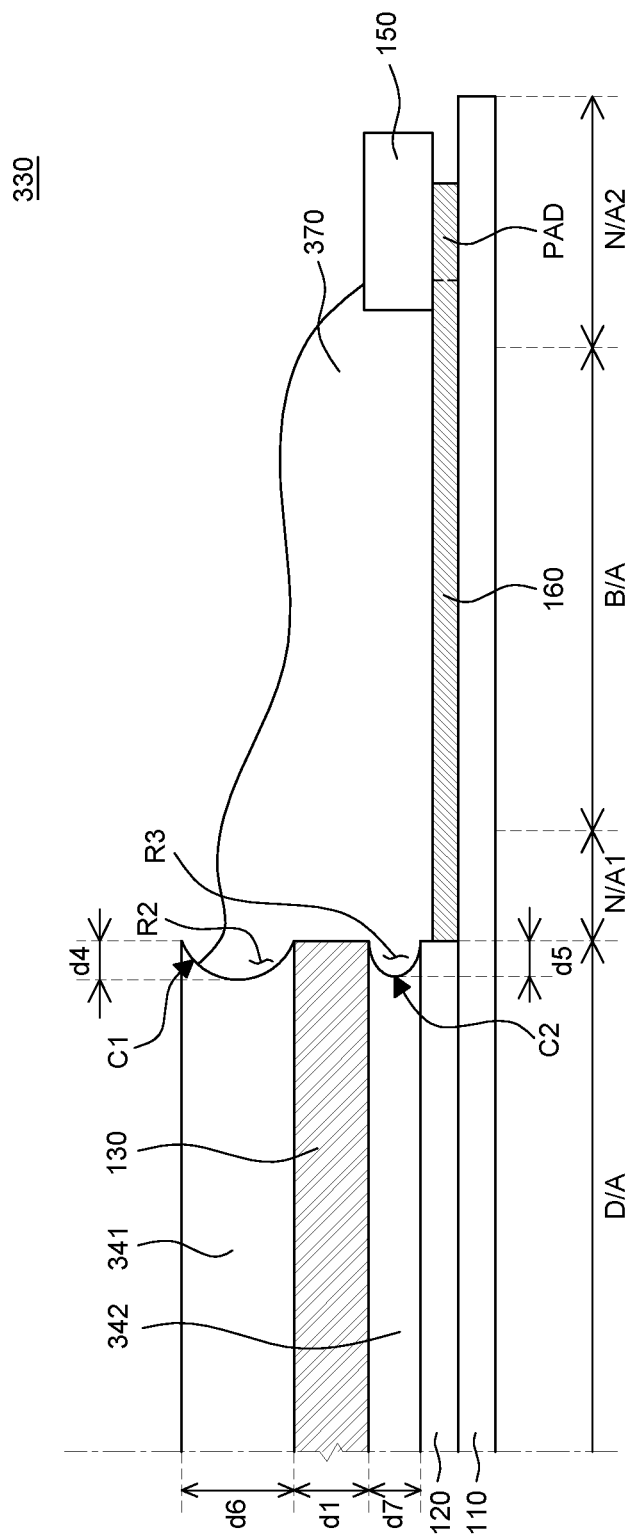
FIG. 3 is a schematic cross-sectional view of an organic light emitting display device according to still another exemplary embodiment of the present disclosure.

FIG. 3 is a schematic cross-sectional view of an organic light emitting display device according to still another exemplary embodiment of the present disclosure. An organic light emitting display device 300 illustrated in FIG. 3 is substantially the same as the organic light emitting display device 200 illustrated in FIGS. 2A and 2B except that adhesive layers 341 and 342 are formed above and below the polarization layer 130 and concave portions C1 and C2 are formed in the adhesive layers 341 and 342, respectively. Therefore, a redundant description will be omitted.

Referring to FIG. 3, the organic light emitting display device 300 includes a flexible substrate 110, a display unit 120, a polarization layer 130, a first adhesive layer 341, a second adhesive layer 342, a module 150, a plurality of wiring lines 160, a pad unit PAD, and a micro coating layer 370.

The first adhesive layer 341 is an adhesive layer formed above the polarization layer 130 to function to bond the polarization layer 130 and a cover glass (not shown) and buffer an external impact. A side of the first adhesive layer 341 which is adjacent to the bending area B/A includes a concavely recessed first concave portion C1. A first receiving portion R2 is formed on an upper surface of the polarization layer 130 adjacent to the bending area B/A by the first concave portion C1. The first adhesive layer 341, the concave portion C1 of the first adhesive layer 341, and the first receiving portion R2 are substantially the same as the adhesive layer 240, the concave portion C1 of the adhesive layer 240, and the receiving portion R2 of the organic light emitting display device 200 illustrated in FIG. 2. Therefore, a redundant description will be omitted.

The second adhesive layer 342 is disposed below the polarization layer 130. The second adhesive layer 342 bonds the polarization layer 130 and the display unit 120 and protects the display unit 120 from the external impact. Further, the second adhesive layer 342 compensates the step by the internal components of the display unit 120.

Referring to FIG. 3, similarly to the first adhesive layer 341, the second adhesive layer 342 disposed below the polarization layer 130 includes a second concave portion C2 on the side adjacent to the bending area B/A. Specifically, the side of the second adhesive layer 342 adjacent to the bending area B/A has a concavely recessed shape.

The second adhesive layer 342 forms a second receiving portion R3 by the second concave portion C2 formed in the side adjacent to the bending area B/A. The second receiving portion R3 is a space which is formed by an inwardly recessed side of the second adhesive layer 342 adjacent to the bending area B/A and receives the micro coating layer 370.

Referring to FIG. 3, the micro coating layer 370 is disposed to fill the first receiving portion R2 and the second receiving portion R3. More specifically, the second receiving portion R3 disposed below the polarization layer 130 may be fully filled with the micro coating layer 370 and the first receiving portion R2 disposed above the polarization layer 130 may be only partially filled with the micro coating layer 370. The height of the micro coating layer 370 of the display area D/A may be primarily reduced by the second receiving portion R3 disposed below the polarization layer 130 and the first receiving portion R2 on the polarization layer 130 may secondarily suppress the micro coating layer 370 from overflowing over the second adhesive layer 342.

A shape and a size of the second concave portion C2 may be appropriately adjusted according to the thickness and the material of the adhesive layer and the thickness and the process of the micro coating layer 370. A depth d5 of the second concave portion C2 may be 30 μm to 150 μm, but is not limited thereto. When the depth d5 of the second concave portion C2 is less than 30 μm, it is difficult to form a sufficient receiving space which may suppress the overflow. Further, when the depth d5 of the second concave portion C2 exceeds 150 μm, the depth of the concave portion is too deep so that the coating composition does not entirely enter the second receiving portion R3 at the time of forming the micro coating layer 370. Therefore, an empty space is formed in the second receiving portion R3. The empty space in the second receiving portion R3 is visible with the naked eye to deteriorate visibility and a rigidity of the components around the empty space including the adhesive layer 140 is weakened, to cause a crack.

In the meantime, the second adhesive layer 342 may be formed of an optically clear adhesive (OCA) which is a transparent adhesive. Generally, in order to attach the polarization layer to the display unit, an adhesive such as a pressure sensitive adhesive (PSA) is used. However, the PSA is an adhesive material to which an adhesive strength is applied by applying a pressure so that the PSA does not have a sufficient thickness to form the concave portion and the receiving portion by the concave portion. Specifically, as it will be described below with reference to FIGS. 4A to 4G, in order to form the concave portion, a process of applying a pressure is necessary. However, when the PSA is used, it may be difficult to form the receiving portion during the process of applying a pressure.

A thickness d6 of the first adhesive layer 341 and a thickness d7 of the second adhesive layer 342 may be appropriately adjusted as needed. As described in the organic light emitting display device 100 of FIGS. 1A and 1B, the thickness of the first adhesive layer 341 may be adjusted to maintain a sufficient adhesive force between the polarization layer 130 and the cover glass and absorb the external impact. For example, the thickness d6 of the first adhesive layer 341 may be 50 µm to 200 µm, but is not limited thereto. The thickness of the second adhesive layer 342 may be adjusted so as to bond the polarization layer 130 and the display unit 120 and protect the display unit 120 from the external impact. For example, the thickness d7 of the second adhesive layer 342 may be 20 µm to 80 µm, but is not limited thereto. When the thickness d7 of the second adhesive layer 342 is less than 20 µm, an effect of suppressing the overflow may be insignificant. When the thickness d7 of the second adhesive layer 342 exceeds µm, the entire thickness of the organic light emitting display device 300 is increased, which may hinder the thin thickness. The thicknesses of the first adhesive layer and the second adhesive layer are not limited thereto.

FIGS. 4A to 4G are schematic cross-sectional views for explaining a manufacturing method of an organic light emitting display device according to another exemplary embodiment of the present disclosure.

Figure 4A:
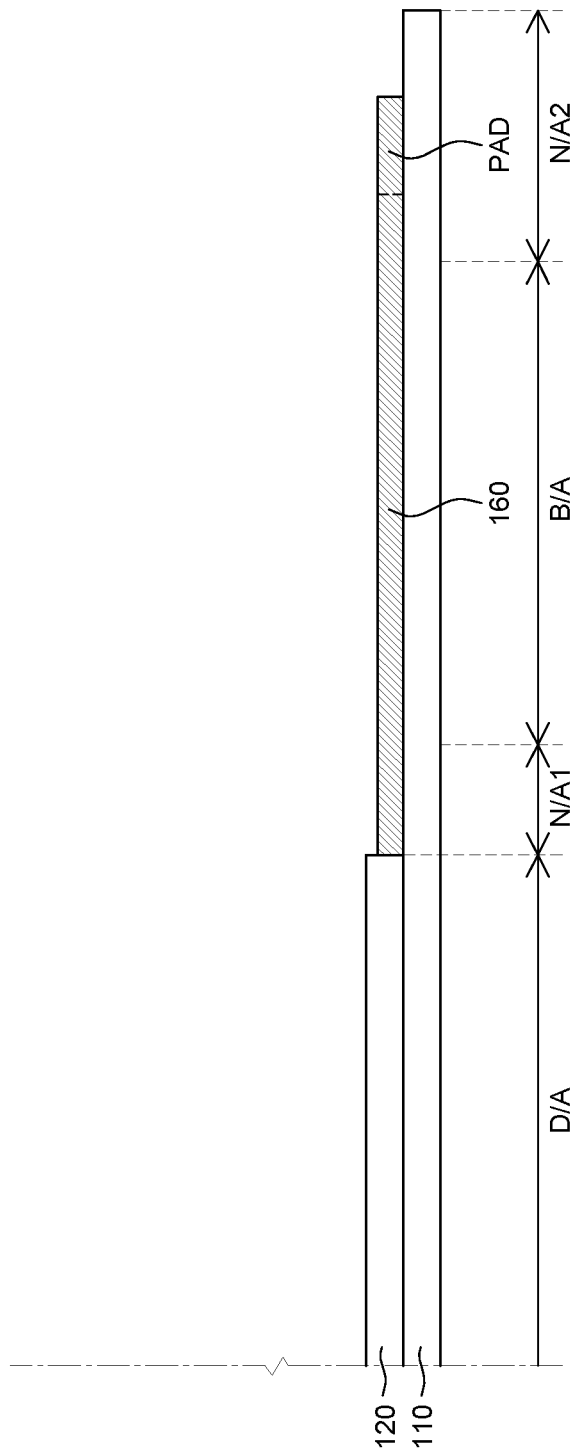
FIGS. 4A to 4G are schematic cross-sectional views for explaining a manufacturing method of an organic light emitting display device according to another exemplary embodiment of the present disclosure.

FIG. 4A illustrates a step of forming a display unit 120 and a plurality of wiring lines 160 on a flexible substrate 110. As described above, the display unit 120 is formed on a display area D/A of the flexible substrate 110. The plurality of wiring lines 160 extends to a first non-display area N/A1, a bending area B/A, and a second non-display area N/A2 from the display area D/A. The plurality of wiring lines 160 is connected to a driving circuit such as a thin film transistor of the display unit 120. Further, the plurality of wiring lines 160 is connected to a plurality of pad electrodes in the second non-display area N/A2. The plurality of pad electrodes configures a pad unit PAD.

Figure 4B:
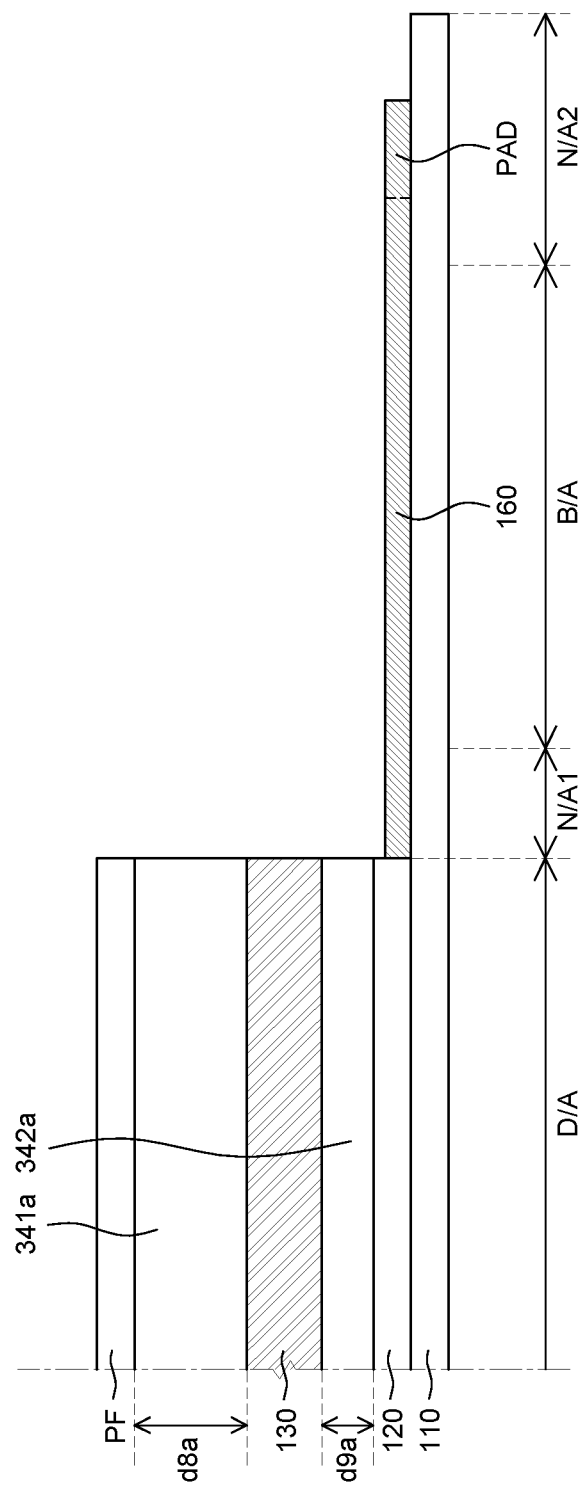

FIG. 4B illustrates a step of laminating a first adhesive layer 341a, a polarization layer 130, and a second adhesive layer 342a. Specifically, the second adhesive layer 342a, the polarization layer 130, the first adhesive layer 341a, and a protective film PF are disposed to be sequentially laminated on the display unit 120. In this case, the protective film is disposed on the first adhesive layer 341a. The first adhesive layer 341a, the second adhesive layer 342a, the polarization layer 130, and the protective film PF may be sequentially laminated through separate processes. Alternatively, a structure in which the second adhesive layer 342a/the polarization layer 130/the first adhesive layer 341a/the protective film PF are laminated is separately manufactured and then attached onto the display unit 120.

The protective film PF is a film for protecting the first adhesive layer 341a and functions to protect the first adhesive layer 341a from an external environment before attaching the cover glass. The protective film PF may be configured by a polymer film such as polyethylene terephthalate (PET), but is not limited thereto.

As described above, a thickness d8a of the first adhesive layer 341a and a thickness d9a of the second adhesive layer 342a may be freely adjusted as needed. For example, the first adhesive layer 341a may have a thickness of 50 µm to 200 µm to bond the cover glass (not shown) and buffer an external impact and a pressure which are transmitted through the cover glass (not shown). The second adhesive layer 342a may have a thickness of 20 µm to 80 µm enough to bond the display unit 120 and the polarization layer 130 and form a concave portion in the second adhesive layer 342a, but the thicknesses are not limited thereto.

Figure 4C:
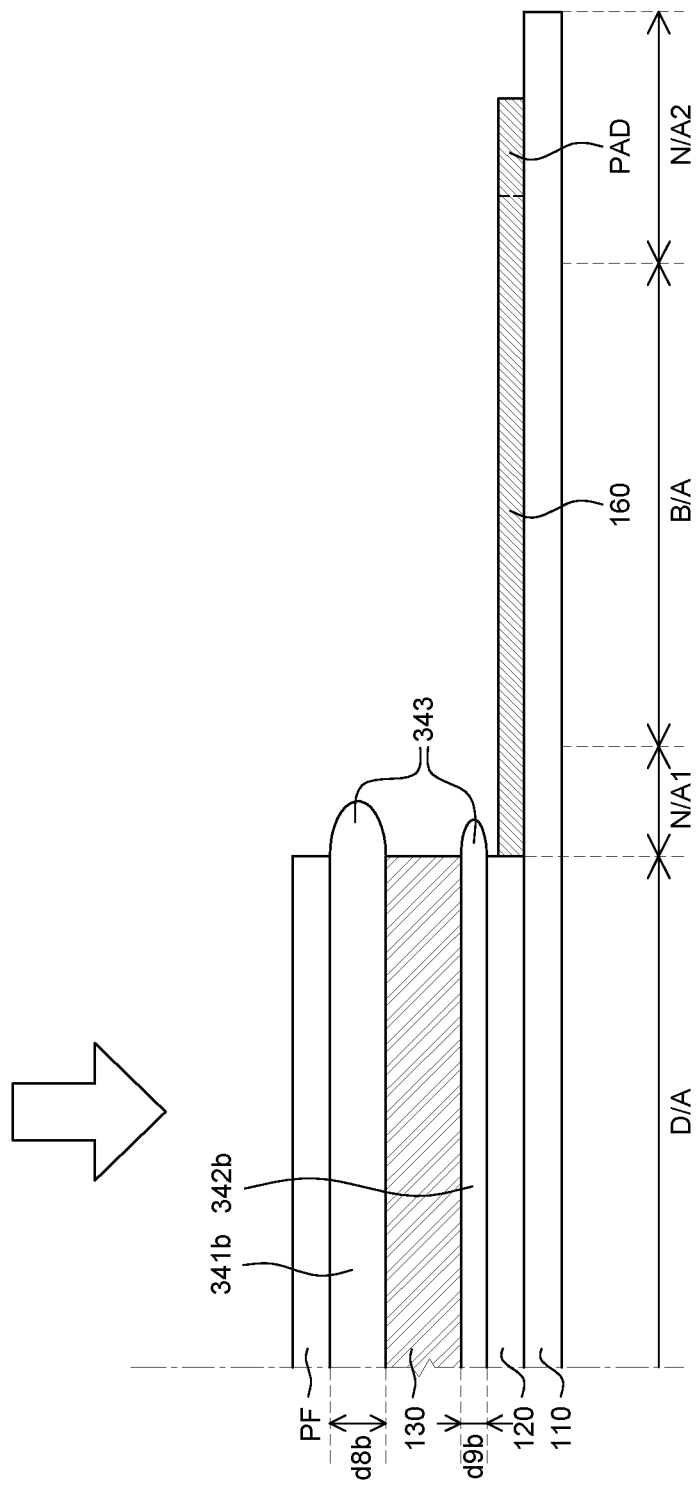

FIG. 4C illustrates a step of applying a pressure on the protective film PF. Specifically, a pressure is downwardly applied to the protective film PF of the display area D/A. The thicknesses of the first adhesive layer 341b and the second adhesive layer 342b having viscoelasticity are reduced due to the pressure. Specifically, due to the pressure, the thickness d8b of the first adhesive layer 341b and the thickness d9b of the second adhesive layer 342b are smaller than the thickness d8a of the first adhesive layer 341 and the thickness d9a of the second adhesive layer 342 before applying the pressure as illustrated in FIG. 4B.

In the meantime, a part of a material which configures the first adhesive layer 341b and a material which configures the second adhesive layer 342b outwardly protrudes more than the display unit 120, the polarization layer 130, and the protective film PF which are adjacent thereto, due to the pressure which is applied to the first adhesive layer 341b and the second adhesive layer 342b. More specifically, referring to FIG. 4C, the materials of the first adhesive layer 341b and the second adhesive layer 342b protrude toward the bending area B/A due to the applied pressure to form a protruding portion 343.

Figure 4D:
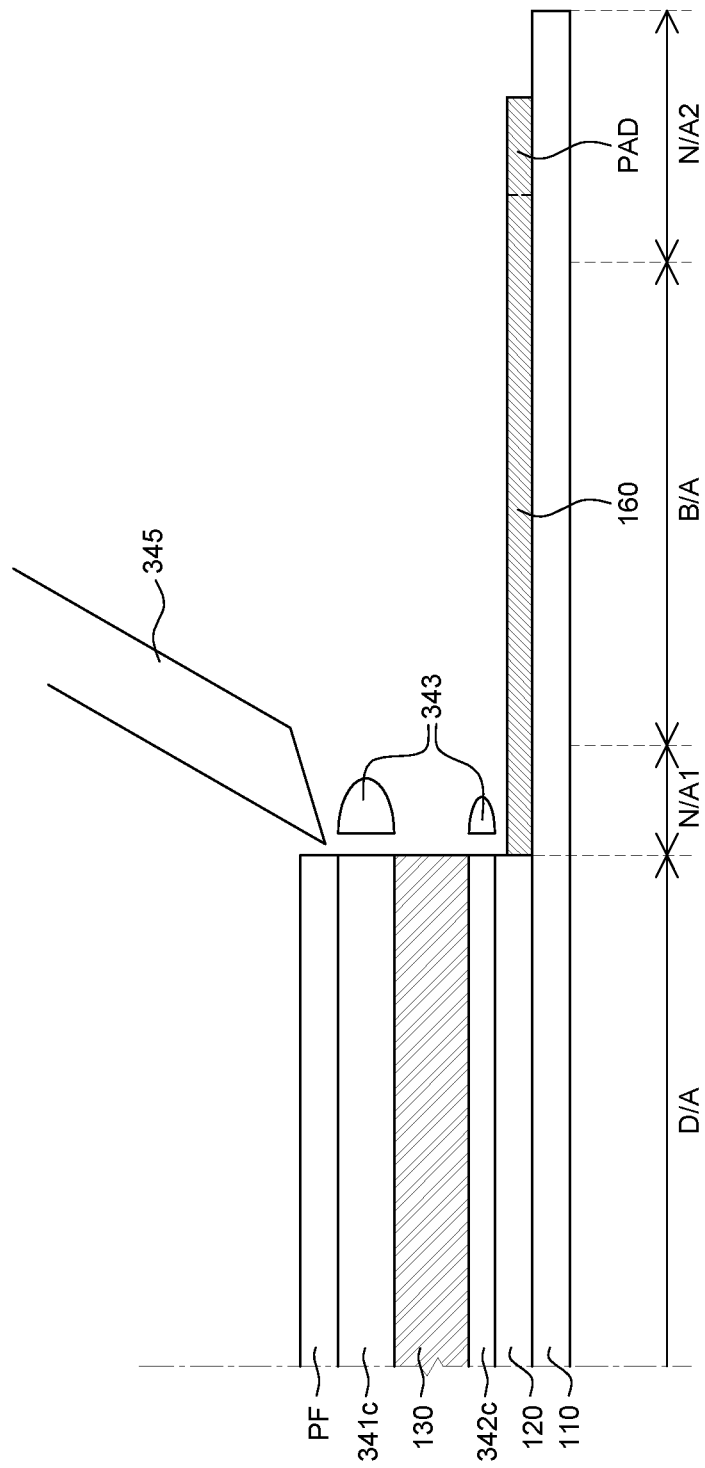

FIG. 4D illustrates a step of removing the protruding portion 343. Specifically, as illustrated in FIG. 4C, the protruding portion 343 of the first adhesive layer and the second adhesive layer which protrudes toward the bending area B/A due to the pressure which is applied in a vertical direction is cut using a cutting tool 345. By doing this, the protruding portion 344 of the first adhesive layer and the second adhesive layer is completely removed from the first adhesive layer 341c and the second adhesive layer 342c.

In this case, the size of the receiving portion formed in the first adhesive layer and the second adhesive layer varies according to the size of the protruding portion 343 to be removed, so that the size of the protruding portion 343 to be removed may be adjusted as needed.

Figure 4E:
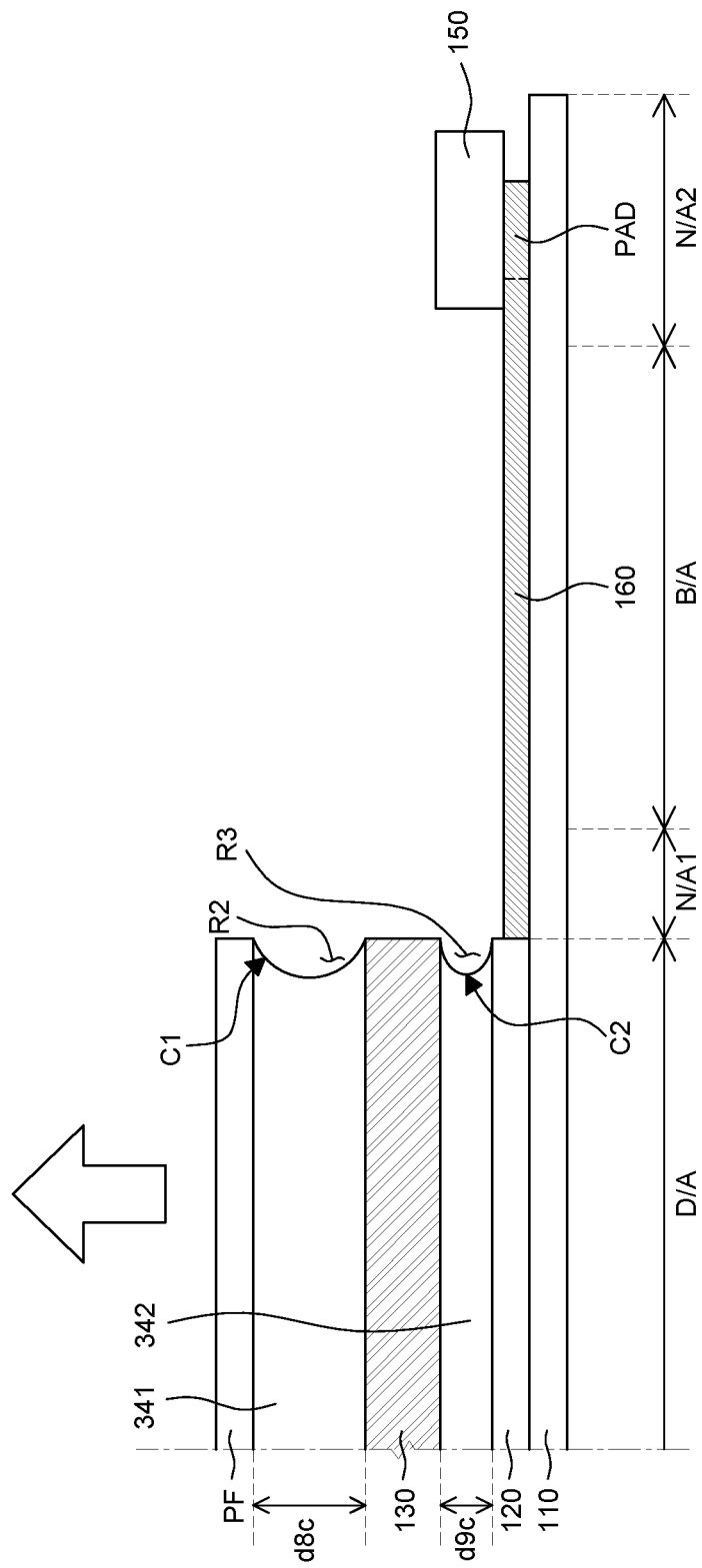

FIG. 4E illustrates a step of forming concave portions in the first adhesive layer 341 and the second adhesive layer 342. Specifically, shapes of components of the display area D/A may be recovered by removing the pressure which is applied to the protective film. Specifically, the thicknesses of the first adhesive layer 341c and the second adhesive layer 342c which have been reduced due to the pressure illustrated in FIG. 4 are increased. Accordingly, the thickness d8c of the first adhesive layer 341 and the thickness d8c of the second adhesive layer 342 illustrated in FIG. 4E are recovered substantially to the thickness before applying the pressure. As the thicknesses of the first adhesive layer 341 and the second adhesive layer 342 are increased, a first concave portion C1 and a second concave portion C2 are formed on the sides of the first adhesive layer 341 and the second adhesive layer 342. Further, the first receiving portion R2 and the second receiving portion R3 which receive the micro coating layer 170 are formed.

In the meantime, after forming the first concave portion C1 and the second concave portion C2 on sides of the first adhesive layer 341 and the second adhesive layer 342, respectively, a module 150 is disposed on the second non-display area N/A2 to be electrically connected to the pad unit PAD.

Figure 4F:
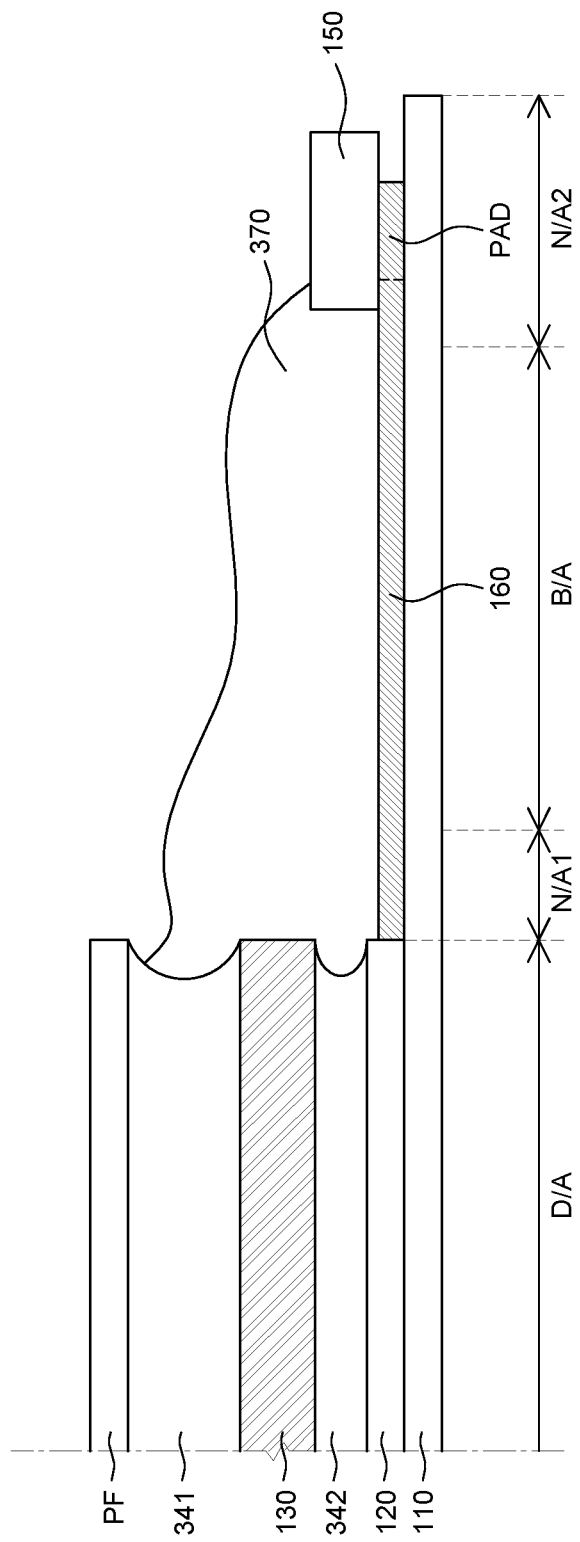

FIG. 4F illustrates a step of forming the micro coating layer 370. The micro coating layer 370 may be formed by coating the coating composition and then hardening the coating composition. In this case, a thickness and a material of the micro coating layer 370 may be appropriately selected to raise a neutral plane of the bending area B/A. The micro coating layer 370 may be formed of an acrylic material or urethane acrylate, but is not limited thereto.

In the meantime, the micro coating layer 370 may be disposed to cover the plurality of wiring lines 160 to protect the plurality of wiring lines 160 of the bending area B/A. More specifically, the micro coating layer 370 may be disposed to extend from the bending area B/A to the second non-display area N/A2. In this case, the micro coating layer 370 may be disposed to cover a part of the upper surface of the module 150. Further, the micro coating layer 370 may be disposed to extend from the bending area B/A to the first non-display area N/A1 to be in contact with the sides of the display unit 120 and the polarization layer 130. Further, a part of the micro coating layer 370 is disposed in the second receiving portion R3 of the second adhesive layer 342 to fully fill the second receiving portion R3. Further, a part of the micro coating layer 370 is disposed in the first receiving portion R2 of the first adhesive layer 341 to fill a partial area of the first receiving portion R2.

Figure 4G:
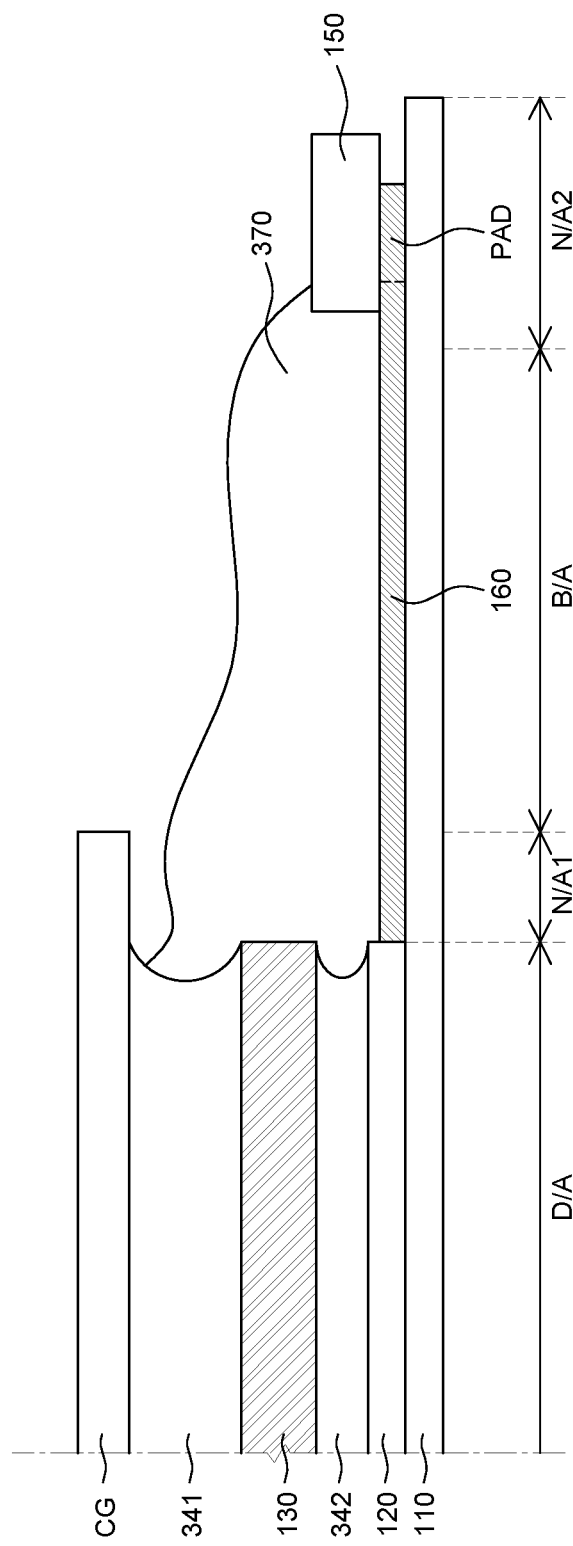

FIG. 4G illustrates a step of disposing the cover glass. Specifically, the cover glass CG is attached after removing the protective film PF disposed on the first adhesive layer 341. The cover glass CG protects the upper surface of the organic light emitting display device. To this end, the cover glass CG is not only disposed on the display area D/A and the first non-display area N/A1, but also disposed to outwardly protrude from the first non-display area N/A1 so as to correspond to a bezel area which is formed after bending the bending area B/A toward the rear surface.

Figure 5A:
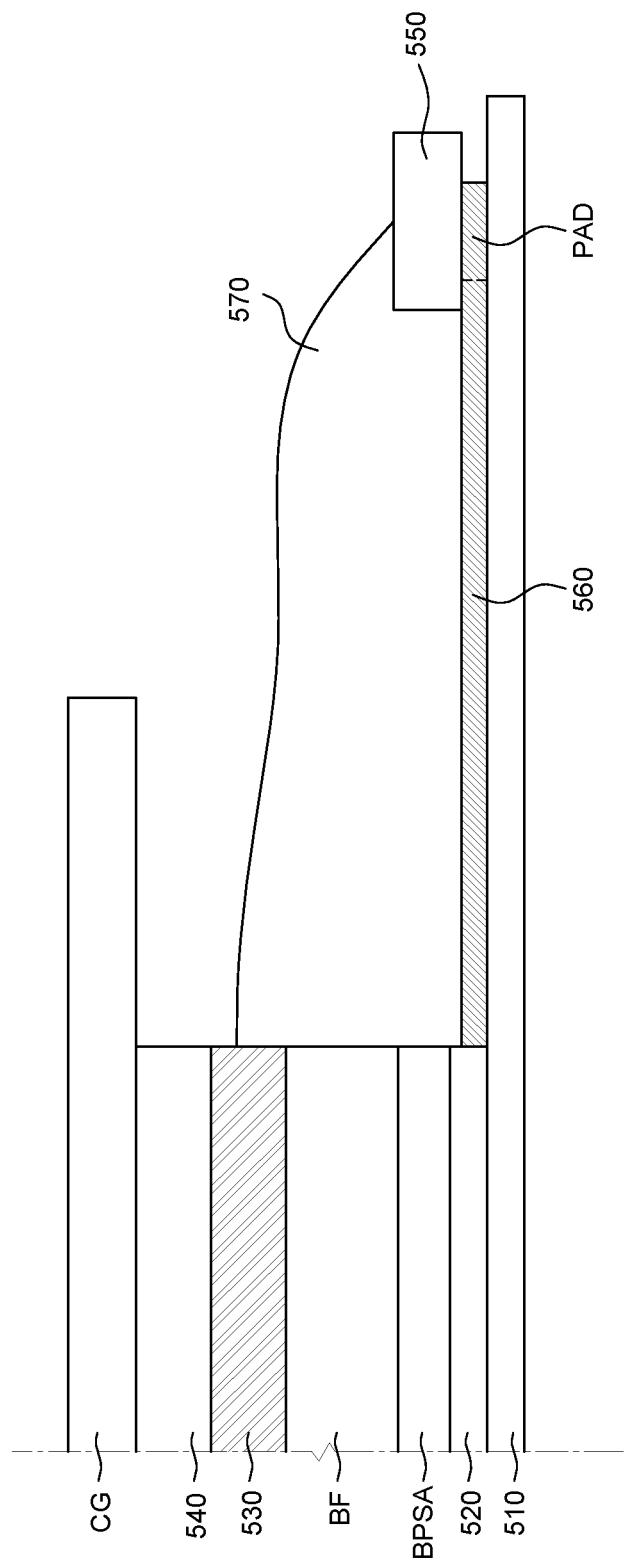
FIGS. 5A and 5B are schematic cross-sectional views for explaining an effect of an organic light emitting display device according to an exemplary embodiment of the present disclosure.
Figure 5B:
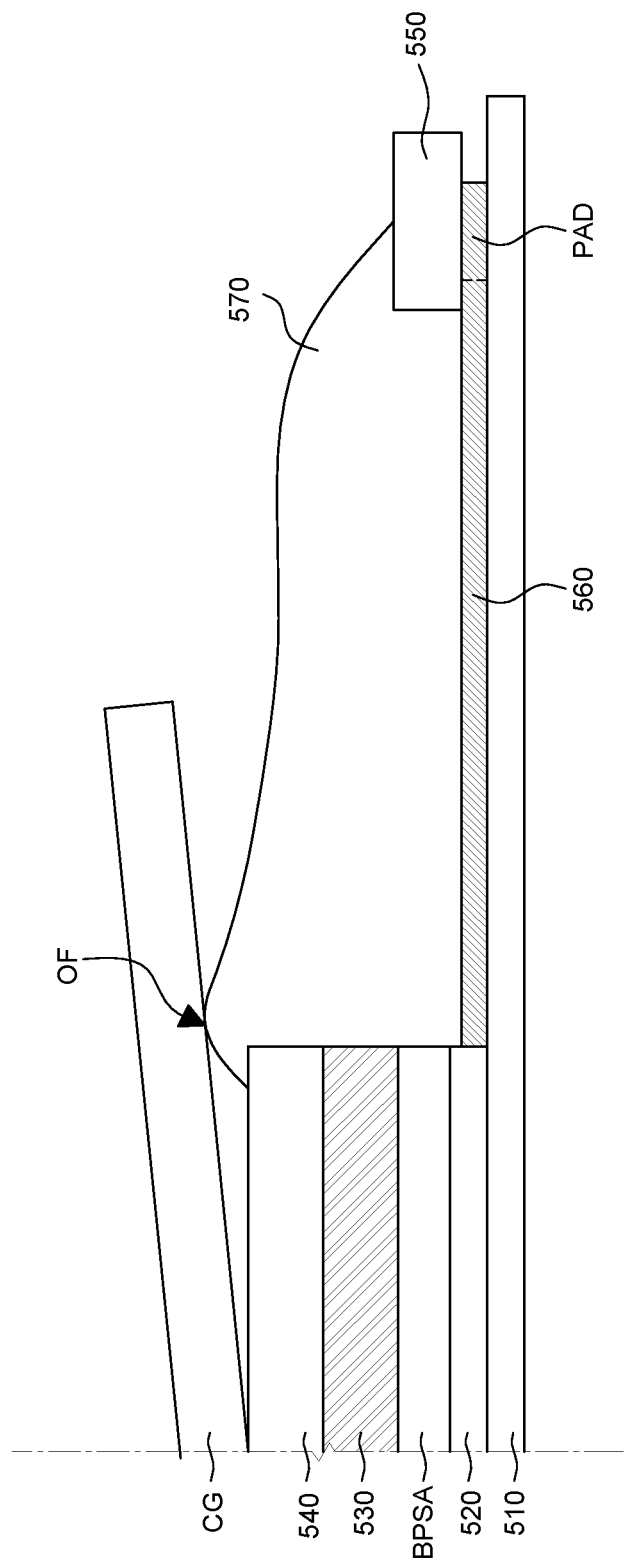

FIGS. 5A and 5B are schematic cross-sectional views for explaining an effect of an organic light emitting display device according to an exemplary embodiment of the present disclosure. FIG. 5A is a schematic cross-sectional view for explaining an organic light emitting display device according to Comparative Example 1 and FIG. 5B is a schematic cross-sectional view for explaining an organic light emitting display device according to Comparative Example 2.

In an organic light emitting display device according to Comparative Example 1 illustrated in FIG. 5A, a barrier film BF is used to block moisture and oxygen which penetrate an organic light emitting element. In the organic light emitting display device illustrated in FIG. 5A, a display unit 520, an adhesive member BPSA which attaches the display unit 520 and the barrier film BF, the barrier film BF, a polarization plate 530, an adhesive layer 540 which attaches the polarization plate 530 and a cover glass CG, and the cover glass CG are disposed in a display area. In this case, when the micro coating layer 570 which is formed to cover the plurality of wiring lines 560 in the bending area covers an upper surface of the adhesive layer 540 or is formed to be higher than the upper surface of the adhesive layer 540, a failure may be generated at the time of bonding the cover glass CG. Therefore, in order to suppress a coating composition for forming the micro coating layer 570 from overflowing, the display unit 520, the adhesive member BPSA, the barrier film BF, the polarization plate 530, and the adhesive layer 540 may serve as a dam. In the organic light emitting display device according to Comparative Example 1, the display unit 520, the adhesive member BPSA, the barrier film BF, the polarization plate 530, and the adhesive layer 540 may provide a sufficient height. Therefore, it is possible to suppress the overflow of the coating composition which is used to form the micro coating layer 570. However, a total thickness of the display unit 520, the adhesive member BPSA, the barrier film BF, and the polarization plate 530 is relatively increased. Specifically, the barrier film BF may have a thickness of 150 µm or larger. Therefore, it is relatively disadvantageous in view of light weight and thin thickness of the organic light emitting display device.

In contrast, in the organic light emitting display device according to Comparative Example 2, the barrier film BF is removed as compared with the organic light emitting display device according to Comparative Example 1. Even though not illustrated in FIGS. 5A and 5B, as described above, an encapsulation unit for protecting the organic light emitting element may be disposed between the display unit 520 and the adhesive member BPSA. Since the performance of the encapsulation unit is significantly improved in recent years, a barrier film BF which suppresses penetration of moisture or oxygen from the outside may not be necessarily used. Therefore, in the organic light emitting display device according to Comparative Example 2, the barrier film BF is removed so that the thickness of the organic light emitting display device may be reduced.

However, the thickness of the barrier film BF is 100 µm to 150 µm, so that when the barrier film BF is removed, a total thickness of components of the display area which serves as a dam is reduced. By doing this, when the micro coating layer 570 is formed in the bending area, a height of a dam which suppresses the coating composition from flowing into the display area during the process of coating the coating composition on the upper surface of the polarization plate is reduced. Therefore, a possibility of an overflow OF problem in that the coating composition flows over the upper surface of the polarization plate disposed in the display area is significantly increased. Therefore, a looseness phenomenon may be generated during a process of bonding an addition configuration such as a cover glass CG on the polarization plate and the visibility may be lowered.

However, in the organic light emitting display device according to the exemplary embodiments of the present disclosure, a side of the adhesive layer adjacent to the bending area is disposed inside more than the side of the polarization layer adjacent to the bending area or the side of the adhesive layer forms a concavely recessed concave portion to form a receiving portion which receives the micro coating layer. The receiving portion which is formed on the same plane as the adhesive layer suppresses the micro coating layer from rising up along the side of the display unit and the polarization layer or from being formed to be higher than the polarization layer. By doing this, the barrier film is removed so that a thin organic light emitting display device having a narrow bezel may be implemented.

The exemplary embodiments of the present disclosure can also be described as follows:

According to an aspect of the present disclosure, an organic light emitting display device includes: a flexible substrate which includes a display area in which a display unit is disposed, a first non-display area enclosing the display area, a bending area extending from the first non-display area, and a second non-display area extending from one side of the bending area, a polarization layer on the display unit, an adhesive layer disposed on at least one of a lower surface and an upper surface of the polarization layer, and a micro coating layer disposed to cover a plurality of wiring lines on the bending area in which at least a part of a side of the adhesive layer adjacent to the bending area is located inside more than a side of the polarization layer adjacent to the bending area.

The adhesive layer may cover only a remaining portion of the upper surface and the lower surface of the polarization layer excluding a portion which is adjacent to the bending area.

A side of the adhesive layer adjacent to the bending area may have a concave shape.

The adhesive layer may be an optically clear adhesive (OCA).

The organic light emitting display device may further include a cover glass in an upper portion of the adhesive layer.

According to an another aspect of the present disclosure, an organic light emitting display device includes: a flexible substrate which includes a display area in which a display unit is disposed, a first non-display area enclosing the display area, a bending area extending from the first non-display area, and a second non-display area extending from one side of the bending area, a display unit formed in the display area of the flexible substrate, a polarization layer on the display unit, an adhesive layer on an upper surface of the polarization layer, and a micro coating layer disposed on the bending area of the flexible substrate to cover a plurality of wiring lines on the bending area in which one end of the adhesive layer adjacent to the bending area is located inside more than one end of the polarization layer.

The polarization layer may be formed to protrude toward the bending area more than the adhesive layer to form a step.

A distance between the one end of the adhesive layer and the one end of the polarization layer may be 30 μm to 300 μm.

The micro coating layer may be disposed to cover a protruding corner of the polarization layer.

According to an yet another aspect of the present disclosure, an organic light emitting display device includes: a flexible substrate which includes a display area in which a display unit is disposed, a first non-display area enclosing the display area, a bending area extending from the first non-display area, and a second non-display area extending from one side of the bending area, a display unit formed in the display area of the flexible substrate, a polarization layer on the display unit, an adhesive layer formed on at least one of a lower surface and an upper surface of the polarization layer, and a micro coating layer disposed on the bending area of the flexible substrate to cover a plurality of wiring lines on the bending area in which a side of the adhesive layer has a concavely recessed concave portion.

A depth of the concave portion may be 30 μm to 150 μm.

The adhesive layer may include a first adhesive layer which attaches the polarization layer and the cover glass to each other and a second adhesive layer which attaches the polarization layer and the display unit to each other and the first adhesive layer may include a first concave portion and the second adhesive layer may include a second concave portion.

A thickness of the first adhesive layer may be 50 μm to 200 μm and a thickness of the second adhesive layer may be 20 μm to 80 μm.

One end of the micro coating layer may be in contact with a module formed in the second non-display area of the flexible substrate and the other end of the micro coating layer may be in contact with the concave portion.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
a flexible substrate which includes a display area in which a display unit is disposed, a first non-display area enclosing the display area, a bending area extending from the first non-display area, and a second non-display area extending from one side of the bending area;
a first adhesive layer disposed on an upper surface of the display unit;
a polarization layer disposed on an upper surface of the first adhesive layer;
a second adhesive layer disposed on an upper surface of the polarization layer;
a cover glass disposed on the second adhesive layer; and
a micro coating layer disposed to cover a plurality of wiring lines on the bending area,
wherein at least a part of a side of the first adhesive layer adjacent to the bending area is located inside more than a side of the polarization layer adjacent to the bending area and at least a part of a side of the second adhesive layer adjacent to the bending area is located inside more than the side of the polarization layer adjacent to the bending area; and
wherein the micro coating layer extends to cover an adjacent corner of a module disposed in the second non-display area of the flexible substrate, the micro coating layer is in contact with a side surface of the polarization layer, and the micro coating layer entirely covers the part of the side of the first adhesive layer that is located inside more than the side of the polarization layer, and partially covers the part of the side of the second adhesive layer that is located inside more than the side of the polarization layer, and the micro coating layer does not contact the cover glass.

2. The organic light emitting display device according to claim 1, wherein the part of the side of the first adhesive layer and the part of the side of the second adhesive layer both have a concave shape.

3. The organic light emitting display device according to claim 1, wherein at least one of the first adhesive layer or the second adhesive layer is an optically clear adhesive (OCA).

4. The organic light emitting display device according to claim 1,
wherein the cover glass is in contact with the second adhesive layer.

5. The organic light emitting display device according to claim 4, wherein the micro coating layer is formed to be lower than an upper surface of the second adhesive layer to suppress overflow of the micro coating layer over the upper surface of the second adhesive layer disposed in the display area.

6. The organic light emitting display device of claim 1, wherein a thickness of the second adhesive layer is 50 μm to 200 μm and a thickness of the first adhesive layer is 20 μm to 80 μm.

7. The organic light emitting display device of claim 1, wherein a distance between the part of the side of the first adhesive layer and the side of the polarization layer is 30 μm to 150 μm, and a distance between the part of the side of the second adhesive layer and the side of the polarization layer 30 μm to 150 μm.

8. An organic light emitting display device, comprising:
a flexible substrate which includes a display area in which a display unit is disposed, a first non-display area enclosing the display area, a bending area extending from the first non-display area, and a second non-display area extending from one side of the bending area;
a first adhesive layer disposed on an upper surface of the display unit;
a polarization layer disposed on an upper surface of the first adhesive layer;
a second adhesive layer disposed on an upper surface of the polarization layer;
a cover glass disposed on the second adhesive layer; and
a micro coating layer disposed on the bending area of the flexible substrate to cover a plurality of wiring lines on the bending area,
wherein a side of the first adhesive layer has a first concavely recessed concave portion and a side of the second adhesive layer has a second concavely recessed concave portion, and
the micro coating layer extends to cover an adjacent corner of a module disposed in the second non-display area of the flexible substrate, and the micro coating layer extends to entirely fill the first concavely recessed concave portion of the first adhesive layer, is in direct contact with a side surface of the polarization layer, and partially fills the second concavely recessed concave portion of the second adhesive layer, and the micro coating layer does not contact the cover glass.

9. The organic light emitting display device according to claim 8, wherein the second adhesive layer attaches the polarization layer and the cover glass to each other.

10. The organic light emitting display device according to claim 8, wherein a thickness of the second adhesive layer is 50 μm to 200 μm and a thickness of the first adhesive layer is 20 μm to 80 μm.

11. The organic light emitting display device according to claim 9, wherein the micro coating layer is formed to be lower than an upper surface of the second adhesive layer to prevent a looseness phenomenon generated during a process of bonding the cover glass on the polarization layer.

12. The organic light emitting display device of claim 8, wherein a depth of the first concavely recessed portion is 30 μm to 150 μm, and a depth of the second concavely recessed portion is 30 μm to 150 μm.

13. The organic light emitting display device of claim 8, wherein the second adhesive layer is in contact with the cover glass.

* * * * *